(12) United States Patent
Harikai et al.

(10) Patent No.: US 9,431,263 B2
(45) Date of Patent: Aug. 30, 2016

(54) PLASMA PROCESSING METHOD AND APPARATUS

(71) Applicant: Panasonic Intellectual Property Management Co., Ltd., Osaka (JP)

(72) Inventors: Atsushi Harikai, Osaka (JP); Noriyuki Matsubara, Osaka (JP); Mitsuru Hiroshima, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/719,797

(22) Filed: May 22, 2015

(65) Prior Publication Data

US 2015/0340208 A1 Nov. 26, 2015

(30) Foreign Application Priority Data

May 26, 2014 (JP) .................. 2014-108202

(51) Int. Cl.

| H01L 21/3065 | (2006.01) |
|---|---|
| H01J 37/32 | (2006.01) |
| C23C 16/505 | (2006.01) |
| C23C 16/458 | (2006.01) |
| C23C 16/455 | (2006.01) |
| H01L 21/308 | (2006.01) |
| H01L 21/67 | (2006.01) |
| H01L 21/683 | (2006.01) |

(52) U.S. Cl.
CPC ......... *H01L 21/3065* (2013.01); *C23C 16/455* (2013.01); *C23C 16/458* (2013.01); *C23C 16/4585* (2013.01); *C23C 16/4586* (2013.01); *C23C 16/505* (2013.01); *H01J 37/321* (2013.01); *H01J 37/3244* (2013.01); *H01J 37/32082* (2013.01); *H01J 37/32651* (2013.01); *H01J 37/32715* (2013.01); *H01J 37/32724* (2013.01); *H01L 21/308* (2013.01); *H01L 21/67069* (2013.01); *H01L 21/6831* (2013.01); *H01L 21/6833* (2013.01); *C23C 16/4583* (2013.01)

(58) Field of Classification Search
None
See application file for complete search history.

(56) References Cited

U.S. PATENT DOCUMENTS

| 2010/0216313 | A1 | 8/2010 | Iwai | |
|---|---|---|---|---|
| 2012/0238073 | A1* | 9/2012 | Johnson | .............. H01L 21/3065 438/464 |
| 2015/0262854 | A1* | 9/2015 | You | ..................... H01L 21/3065 438/692 |

FOREIGN PATENT DOCUMENTS

| JP | 4858395 B2 | 11/2011 | | |
|---|---|---|---|---|
| KR | 10-2012-0138084 | * | 3/2014 | ......... H01L 21/3065 |

* cited by examiner

Primary Examiner — Jiong-Ping Lu
(74) Attorney, Agent, or Firm — Pearne & Gordon LLP (57) ABSTRACT

A plasma processing method to a substrate includes a first step of mounting a transfer carrier holding the substrate on a stage which is cooled and provided within a processing chamber; a second step of relatively moving the stage and a cover provided above the stage to cover a holding sheet and an annular frame of the transfer carrier with the substrate exposed from a window part formed at the cover, a third step of carrying out plasma processing on the substrate, a fourth step of cooling the cover, and a fifth step of unloading the transfer carrier holding the substrate from the processing chamber.

8 Claims, 5 Drawing Sheets

PLASMA PROCESSING METHOD AND APPARATUS

CROSS REFERENCE TO RELATED APPLICATION(S)

The present PIPM disclosure relates to the subject matters contained in Japanese Patent Application No. 2014-108202 filed on May 26, 2014, which are incorporated herein by reference in its entirety.

FIELD

One or more embodiments of the present invention relate to a plasma processing method and an apparatus.

BACKGROUND

Patent literatures 1 and 2 mentioned below disclose examples of plasma processing apparatuses. Each of these plasma processing apparatuses carries out plasma processing such as plasma dicing and plasma ashing on a substrate in a state of holing the substrate on a transfer carrier constituted of an annular frame and a holding sheet. At the time of the plasma processing, both the annular frame and the holding sheet are covered by a cover so that each of the annular frame and the holding sheet is not exposed to plasma.

Patent Literature 1 is Japanese Patent No. 4858395, and Patent Literature 2 is U.S. Patent publication No. 2012/0238073.

SUMMARY

However, in each of these plasma processing apparatuses of the related art, the cover is heated by plasma, and hence before unloading the transfer carrier, the holding sheet made of resin material and an adhesive for fixing the holding sheet to the annular plate receive radiation heat from the cover. Thus, each of the holding sheet and the adhesive may be thermally damaged. That is, for example, the holding sheet may be extended (deformed) and the holding sheet may be peeled off the annular frame due to deterioration of adhesiveness of the adhesive material.

In particular, when electrostatic attraction of the transfer carrier to a stage is stopped before the unloading, cooling of the transfer carrier by the stage is not performed sufficiently. Thus, the holding sheet is liable to be damaged thermally.

In view of the aforesaid circumstances, one of objects of the invention is to prevent a holding sheet of a transfer carrier from being thermally damaged due to plasma processing.

According to an embodiment of the invention, there is provided a plasma processing method of carrying out plasma processing within a processing chamber on a substrate which is held by a transfer carrier constituted of an annular frame and a holding sheet, the method including:

a first step of mounting the transfer carrier holding the substrate on a stage which is cooled and provided within the processing chamber;

a second step of relatively moving the stage and a cover provided above the stage to cover the holding sheet and the frame of the transfer carrier by the cover in a state of exposing the substrate from a window part formed at the cover;

a third step of carrying out plasma processing on the substrate held by the transfer carrier;

a fourth step of cooling the cover; and a fifth step of unloading the transfer carrier holding the substrate from the processing chamber.

According to the embodiments, as the fourth step of cooling the cover is executed between the third step of carrying out the plasma processing and the fifth step of unloading the transfer carrier, the holding sheet can be prevented from being thermally damaged by radiation heat irradiated from the cover.

BRIEF DESCRIPTION OF THE DRAWINGS

A general configuration that implements the various features of the invention will be described with reference to the drawings. The drawings and the associated descriptions are provided to illustrate embodiments of the invention and should not limit the scope of the invention.

DETAILED DESCRIPTION OF THE EMBODIMENTS

Hereinafter, embodiments according to the invention will be explained with reference to attached drawings. Incidentally, following explanation merely shows examples of the invention, and is not intended to limit the invention and the applications and usage of the invention. Further, the attached drawings are schematic and ratios of respective sizes etc. in the drawings differ from those of an actual product.

Figure 1:
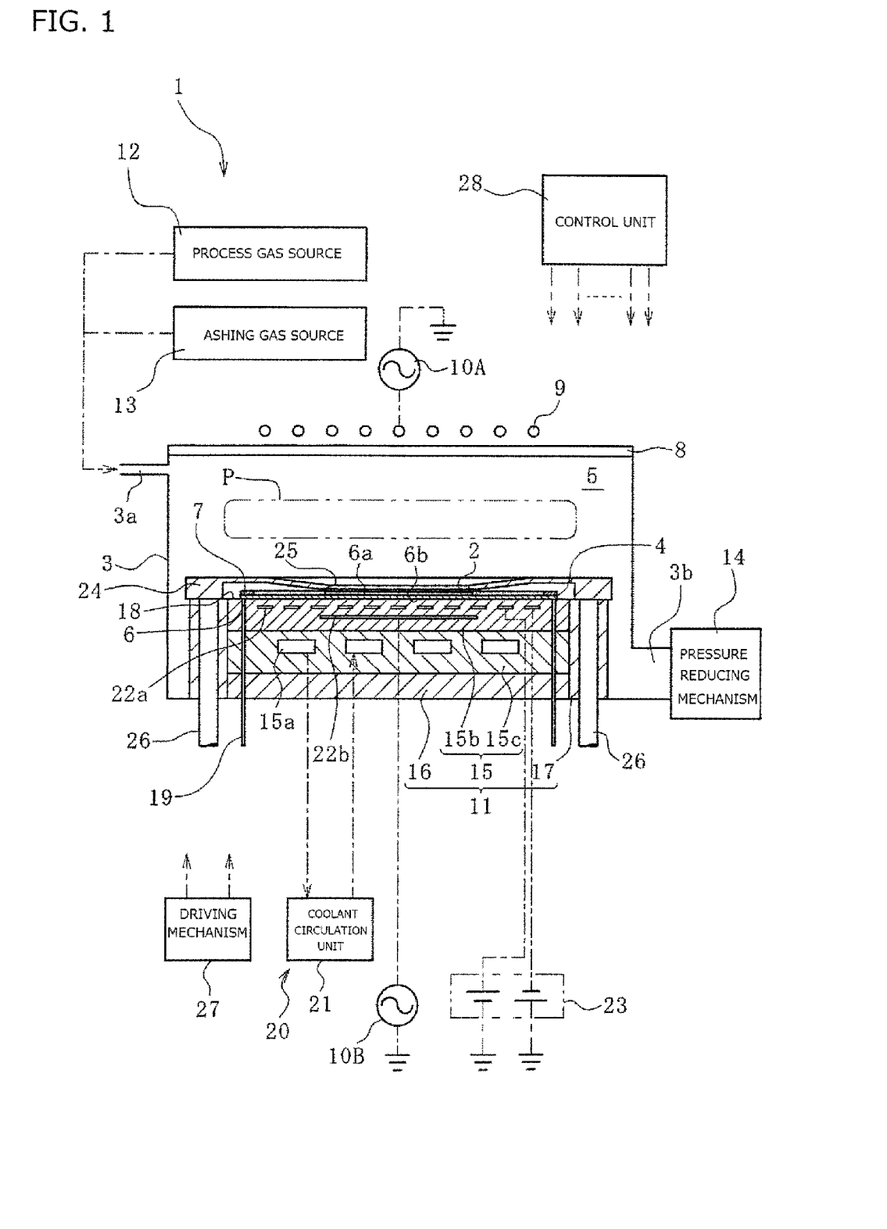
FIG. 1 is a schematic front sectional view of a plasma processing apparatus according to an embodiment.

FIG. 1 shows a plasma processing apparatus 1 according to an embodiment of the invention. The plasma processing apparatus 1 is used for carrying out plasma processing on a wafer 2 (substrate) and includes a chamber 3. The chamber 3 has an inner space which pressure is reducible. The chamber 3 is configured so as to be able to load a transfer carrier 4 into and unload it from a processing chamber 5 as an inner space via not-shown input/output ports.

The transfer carrier 4 has a holding sheet 6 for detachably holding the wafer 2. As the holding sheet 6, for example, a so-called UV (ultraviolet) tape can be used. The UV tape is elastically extendable and holds the wafer 2 by an adhesive force thereof. However, when the UV tape receives ultraviolet rays, chemical properties of the UV tape changes and the adhesive force thereof reduces to a large extent. The holding sheet 6 is configured by one surface having adhesiveness (adhesive surface) and an opposite surface having no adhesiveness (non-adhesive surface). The holding sheet 6 is flexible and cannot keep a constant shape by itself because it bends easily. In view of this fact, a thin frame 7 (annular frame) of an almost ring shape is adhered on the adhesive surface near the outer circumferential edge of the holding sheet 6. The frame 7 is made of, for example, metal and has rigidity capable of keeping its shape.

The holding sheet 6 of the transfer carrier 4 holds the wafer 2 in a manner that a rear surface of the wafer 2 is adhered to the adhesive surface of the holding sheet. The wafer 2 is disposed at the center of a circular area surrounded by the frame 7 on the adhesive surface of the holding sheet 6. More specifically, the position of the wafer 2 is set with respect to the holding sheet 6 in a manner that the center of the circular area almost coincides with the center of the wafer 2. As the wafer 2 is disposed at the center of the circular area, a wide annular area of a constant width is formed on the holding sheet 6 between the outer circumference of the wafer 2 and the inner circumference of the frame 7.

An antenna 9 (plasma source) acting as an upper electrode is disposed above a dielectric wall 8 which closes a top part of the chamber 3 (vacuum vessel) of the plasma processing apparatus 1. The antenna 9 is electrically connected to a first radio-frequency (RF) power source 10A. A stage 11 is disposed at the bottom part side within the chamber 3. The transfer carrier 4 holding the wafer 2 as explained above is mounted on the stage 11. A process gas source 12 and an ashing gas source 13 are coupled to a gas introduction port 3a of the chamber 3. A pressure reducing mechanism 14 having a vacuum pump for evacuating the chamber 3 and a pressure regulating valve for regulating a pressure within the chamber 3 is coupled to an exhaust port 3b.

The stage 11 includes an electrode part 15, a base part 16 disposed on the lower end side of the electrode part, and an exterior part 17 which surrounds the outer circumference of each of the base part and the electrode part.

The electrode part 15 is configured of an electrostatic chuck 15b and an electrode part body 15c disposed on the lower end side of the electrostatic chuck.

The electrostatic chuck 15b is constituted of dielectric material such as ceramic. The electrostatic chuck 15b contains electrostatic chucking (ESC; Electric Static Chuck) electrodes 22a of bipolar type at the upper area thereof and a radio-frequency electrode 22b at the lower area thereof. ADC power source 23 is electrically connected to the electrostatic chucking electrodes 22a. The electrostatic chucking electrodes 22a are disposed at an upper area of the electrostatic chuck 15b which corresponds to an entirety of an upper surface area of the electrode part 15 where the transfer carrier 4 is mounted. Thus, the transfer carrier 4 can be electrostatically attracted to the stage. A second radio-frequency power source 10B is electrically connected to the radio-frequency electrode 22b. An outer circumferential edge of the radio-frequency electrode 22b locates outside of the wafer 2 mounted on the transfer carrier 4 in planar view. As a result, the wafer 2 can be entirely etched by plasma having been generated.

The electrode part body 15c is constituted of metal (aluminum alloy, for example). A coolant passage 15a is formed in the electrode part body 15c.

An upper surface of the electrode part 15 and an upper surface of the exterior part 17 constitute a mounting surface 18 serving as a single horizontal plane on which the transfer carrier 4 holding the wafer 2 is mounted. A plurality of first through holes each penetrating the lower and upper surfaces of the electrode part 15 are disposed with a constant interval along the circumferential direction of the electrode part 15. A projection pin 19 is disposed within each of the first through holes so as to be movable up and down. The transfer carrier 4 is mounted on the upper end surface of each of the projection pins 19 in a state that the upper end surface of each of the projection pins is flush with the mounting surface 18 to constitute a common surface. The transfer carrier 4 is separated from the mounting surface 18 by protruding the projection pins 19 upward from the mounting surface 18.

The exterior part 17 is constituted of ground shield material (metal having conductivity and etching resistance).

A plurality of second through holes each penetrating the lower and upper surfaces of the exterior part in an upper-lower direction are disposed with a constant interval along the circumferential direction of the exterior part. A driving rod 26 is disposed within each of the second through holes so as to be movable up and down. The exterior part 17 protects the electrode part 15 and the base part 16 from plasma.

The transfer carrier 4 is mounted on the stage 11 in an upward posture that the surface (adhesive surface 6a) of the holding sheet 6 holding the wafer 2 is directed upward and the non-adhesive surface 6b of the holding sheet 6 is placed on the mounting surface 18. The transfer carrier 4 is mounted on the mounting surface 18 of the stage 11, by means of a not-shown transfer mechanism, at a predetermined position and posture (including a rotation angle position around the center of the circular area of the holding sheet 6) with respect to the mounting surface. Hereinafter, this predetermined position and posture is described as a normal position.

The plasma processing apparatus 1 includes a cooling unit 20 for cooling the stage 11. The cooling unit 20 includes the coolant passage 15a formed in the electrode part 15 and a coolant circulation unit 21 for circulating temperature-controlled coolant within the coolant passage 15a.

The chamber 3 contains a cover 24 movable up and down in an interior space of this chamber above the mounting surface 18 of the stage 11. The cover 24 has an outer contour of a circular shape and has a constant thin thickness. A window part 25 is formed at the center of the cover. The cover 24 covers the holding sheet 6 and the frame 7 of the transfer carrier 4 during plasma processing, thereby protecting them from plasma. To this end, the cover 24 is configured to have the outer contour larger than that of the transfer carrier 4.

The cover 24 is mounted on the driving rods 26 in a manner that a lower surface of the cover 24 contacts to the upper end surfaces of the driving rods 26. The driving rods 26 are driven so as to move up and down by a driving mechanism 27 conceptually shown only in FIG. 1. The cover 24 is moved up and down in accordance with the up-down movement of the driving rods 26. More specifically, the cover 24 can be positioned at a lowered position where the cover 24 is mounted on the mounting surface 18 of the stage 11, a first raised position above the lowered position, and a second raised position (highest position) above the first raised position. The cover 24 at the lowered position locates at a position, with respect to the holding sheet 6 of the transfer carrier 4 mounted on the mounting surface 18 of the stage 11, that the cover 24 protects the holding sheet 6 and the frame 7 from plasma during plasma processing but is not made contact therewith. As the cover 24 at the lowered position is not made contact with the holding sheet 6, heat of the cover 24 heated by plasma processing can be prevented from being directly transmitted to the holding sheet 6. Further, the adhesive surface of the holding sheet 6 can be prevented from contacting and adhering to the cover 24.

The cover 24 at the first raised position is separated from the holding sheet 6 of the transfer carrier 4 mounted on the mounting surface 18 of the stage 11 so as to secure a sufficiently large distance therebetween. Thus, thermal damage due to radiation heat from the cover 24 can be suppressed from affecting on the holding sheet 6.

The cover 24 at the second raised position is disposed above the mounting surface 18 of the stage 11 with a sufficient distance therefrom. Thus, when the cover 24 locates at the second raised position, it is possible to perform both an operation of loading the transfer carrier 4 (holding the wafer 2) onto the mounting surface 18 and an operation of unloading the transfer carrier 4 from the mounting surface 18.

A control unit 28 schematically shown only in FIG. 1 controls operations of respective constituent elements of the plasma processing apparatus 1 including the first and second radio-frequency power sources 10A and 10B, the process gas source 12, the ashing gas source 13, the pressure reducing mechanism 14, the cooling unit 20, the DC power source 23 and the driving mechanism 27.

Next, operations of the plasma processing apparatus 1 according to the embodiments will be explained with reference to FIGS. 2 and 3.

Figure 2A:
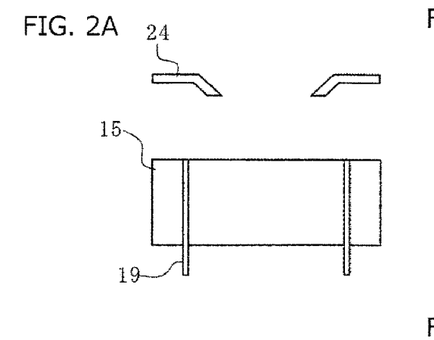
FIGS. 2A to 2H are schematic diagrams for explaining processing steps executed by the plasma processing apparatus of FIG. 1.
Figure 2B:
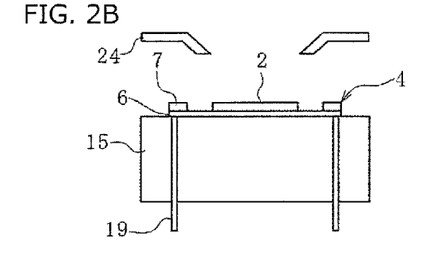
Figure 3:
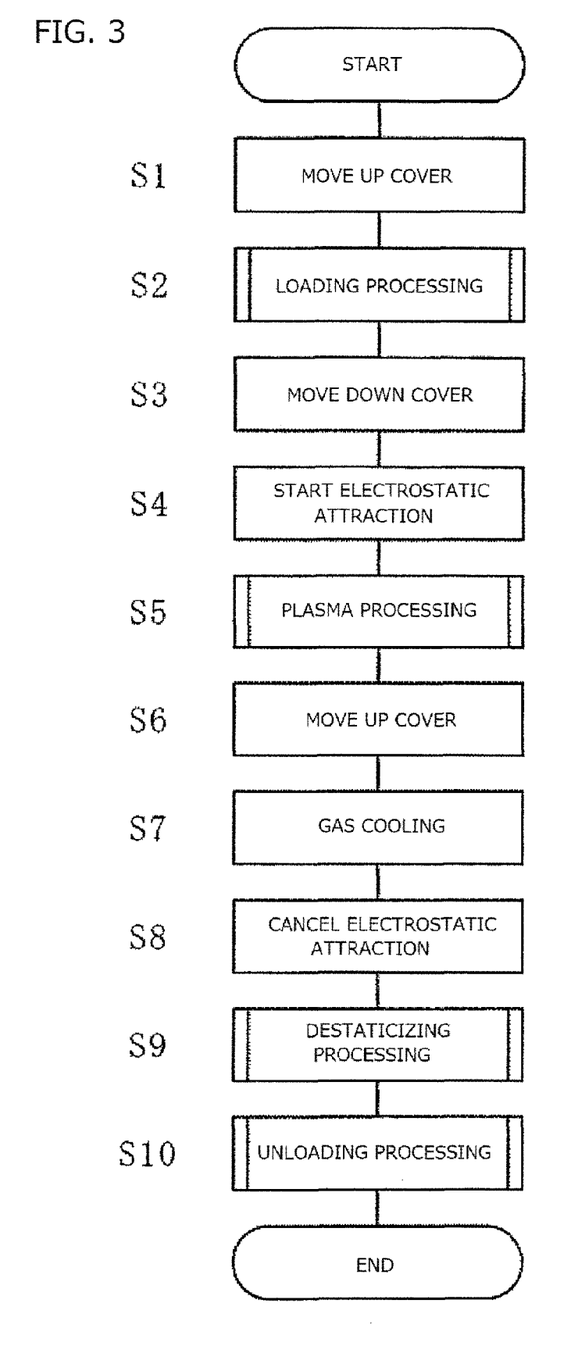
FIG. 3 is a flowchart showing plasma processing according to the embodiment.

As shown in FIG. 2A, the cover 24 is moved up to the second raised position (step S1). Then, as shown in FIG. 2B, the transfer carrier 4, adhering the wafer 2 to the center of the circular area of the holding sheet 6, is loaded into the chamber 3 by means of the not-shown transfer mechanism and mounted on the normal position of the mounting surface 18 of the stage 11 (step S2: loading processing).

Figure 2C:
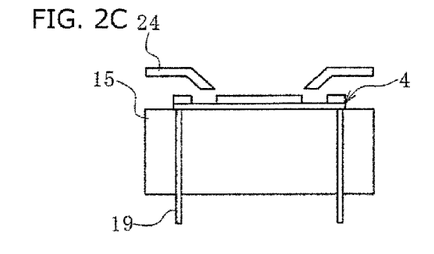

Then, as shown in FIG. 2C, the driving rods 26 are driven by the driving mechanism 27 to move the cover 24 down to the lowered position from the second raised position (step S3). When the cover 24 reaches the lowered position, the cover 24 covers the holding sheet 6 and the frame 7 of the transfer carrier 4 and exposes the wafer 2 from the window part 25 of the cover 24. At this lowered position, the cover 24 does not contact the holding sheet 6 or the frame 7.

Then, the DC power source 23 supplies DC voltage to the electrostatic chucking electrodes 22a, whereby the transfer carrier 4 is electrostatically attracted and held on the mounting surface 18 (upper end surface of the electrode part 15) of the stage 11 (step S4). In this state, temperature of the stage 11 is adjusted to a range from 15 to 20 C.°, whilst temperature of the transfer carrier 4 is kept at almost 20 C.° because the transfer carrier is adhered to the mounting surface 18 of the stage 11.

Figure 2D:
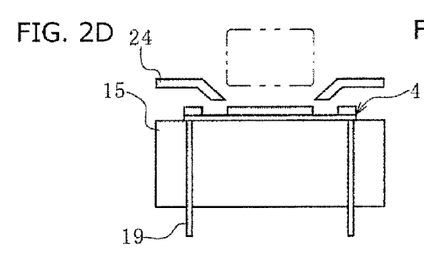

Then, as shown in FIG. 2D, following respective plasma processing (step S5: plasma dicing and plasma ashing) are executed.

In the plasma dicing, process gas (SF6, for example) is introduced into the chamber 3 from the process gas source 12 while the process gas is exhausted by the pressure reducing mechanism 14, whereby a pressure within the processing chamber 5 is kept to a predetermined value (10 Pa, for example) Thereafter, the radio-frequency power source 10A supplies radio-frequency power (2,000 W, for example) to the antenna 9 to generate plasma P within the chamber 3. Plasma thus generated is irradiated to the wafer 2 exposed from the window part 25 of the cover 24. In this case, the radio-frequency power source 10B applies bias voltage (50 W, for example) to the electrode part 15 of the stage 11. Further, the cooling unit 20 cools the stage 11 (200°, for example). A resist mask for defining a chip area is already formed on the surface of the wafer 2 at a preceding process. When the plasma processing is carried out on the wafer 2 having the resist mask, the wafer 2 is etched away at portions (streets) not protected by the resist mask on the surface of the wafer 2, due to physicochemical action between ions and radicals in the plasma P. The etching process is continued to the rear surface of the wafer 2, whereby the wafer 2 is divided into respective chips.

In the plasma ashing, ashing process gas (oxygen gas, for example) is introduced into the chamber 3 from the ashing gas source 13 while the ashing process gass is exhausted by the pressure reducing mechanism 14, whereby a pressure within the processing chamber 5 is kept to a predetermined value (10 Pa, for example). Thereafter, the radio-frequency power source 10A supplies radio-frequency power (2,000 W, for example) to the antenna 9 to generate oxygen plasma P within the chamber 3. Oxygen plasma thus generated is irradiated to the wafer 2 exposed from the window part 25 of the cover 24. The resist mask is completely removed from the surface of the wafer 2 by the irradiation of the oxygen plasma P.

In the plasma processing, as the transfer carrier 4 is attracted to the mounting surface 18 of the stage 11 by electrostatic attraction, the transfer carrier is effectively cooled by the cooling unit 20 provided at the stage 11. In this state, although temperature of the cover 24 increases to about 230 C.°, temperature of the transfer carrier 4 is adjusted to a range from 30 to 40 C.° because the transfer carrier is kept to be electrostatically attracted to the stage 11 as described above.

Figure 2E:
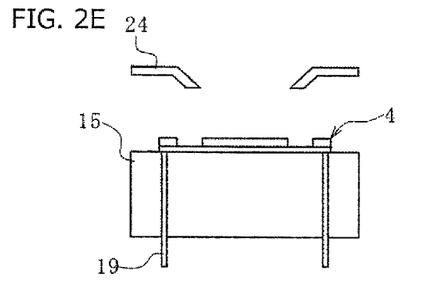
Figure 2F:
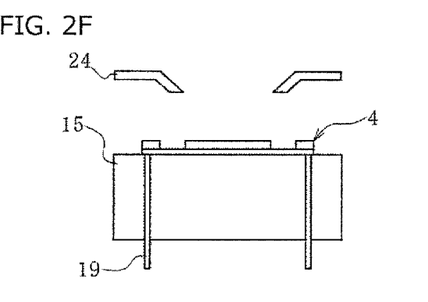

When the plasma processing terminates, as shown in FIG. 2E, the driving rods 26 are driven by the driving mechanism 27 to move the cover 24 up to the first raised position from the lowered position (step S6). Thus, an amount of radiation heat irradiated to the holding sheet 6 of the transfer carrier 4 from the cover 24 heated in the plasma processing etc. is reduced. In this state, as shown in FIG. 2F, cooling gas is introduced into the chamber 3 from the process gas source 12 while the cooling gas is exhausted by the pressure reducing mechanism 14, whereby a pressure within the processing chamber 5 is kept to a predetermined value (step S7). In this case, pressure within the processing chamber 5 is preferably set to a high value (in a range from 30 to 100 Pa, for example) as compared with a value (almost in a range from 1 to 20 Pa, for example) at a time of supplying the process gas during the processing. Inert gas such as He or Ar can be used as the cooling gas. As the cover 24 is cooled by supplying the cooling gas into the chamber 3, the holding sheet 6 can be placed in a state of being scarcely affected by radiation heat from the cover. In this state, the cover 24 is cooled to about 180 C.°, and the transfer carrier 4 is kept to be electrostatically attracted to the stage 11 as described above. Thus, temperature of the transfer carrier 4 is maintained to a range from 30 to 40 C.°.

Figure 2G:
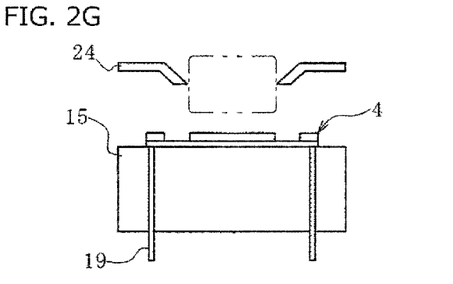

When the cooling process using the cooling gas terminates, application of the DC voltage to the electrostatic chucking electrodes 22a from the DC power source 23 is stopped, whereby the electrostatic attraction is cancelled (step S8). In this state, due to residual attraction caused by residual charges remained in the wafer 2 having been charged during the plasma processing, the transfer carrier 4 may not be moved up suitably by merely moving the projection pins 19 up. In view of this, as shown in FIG. 2G, destaticizing gas is introduced into the chamber 3 from the process gas source 12 and destaticizing processing is executed (step S9). Inert gas such as He or Ar can be used as the destaticizing gas. The radio-frequency power source 10A supplies radio-frequency power (about 100 W in this case) to the antenna 9 to generate plasma. In this case, the destaticizing gas is exhausted by the pressure reducing mechanism 14, whereby pressure within the processing chamber 5 is kept to a predetermined value. The residual charges of the wafer 2 is eliminated by the destaticizing gas thus introduced. In this state, as the adhered state of the transfer carrier 4 to the stage 11 is cancelled, heat radiation of the transfer carrier 4 to the sheet 11 is not performed sufficiently. However, as described above, the cover 24 is located at the first raised position and cooled by the cooling gas. Thus, a phenomenon that temperature of the transfer carrier 4 is increased due to radiation heat irradiated from the cover 24 and the holding sheet 6 is thermally damaged, can be prevented from occurring. In this case, temperature of the holding sheet 6 is suppressed almost to a range from 70 to 80 C.°.

Figure 2H:
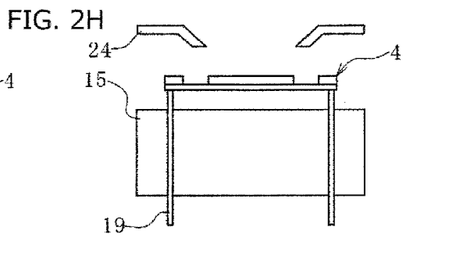

When the destaticizing processing is terminated, as shown in FIG. 2H, the projection pins 19 are moved up to thereby move the transfer carrier 4 up. As the transfer carrier 4 is destaticized, the transfer carrier is not attracted to the stage 11 by the residual charges. Thus, the transfer carrier 4 can be moved up smoothly. The transfer carrier 4 thus moved up is unloaded from the chamber 3 by the not-shown transfer mechanism (step S10: unloading processing).

The invention is not limited to the configuration described in the embodiment but various modifications can be made.

Figure 4:
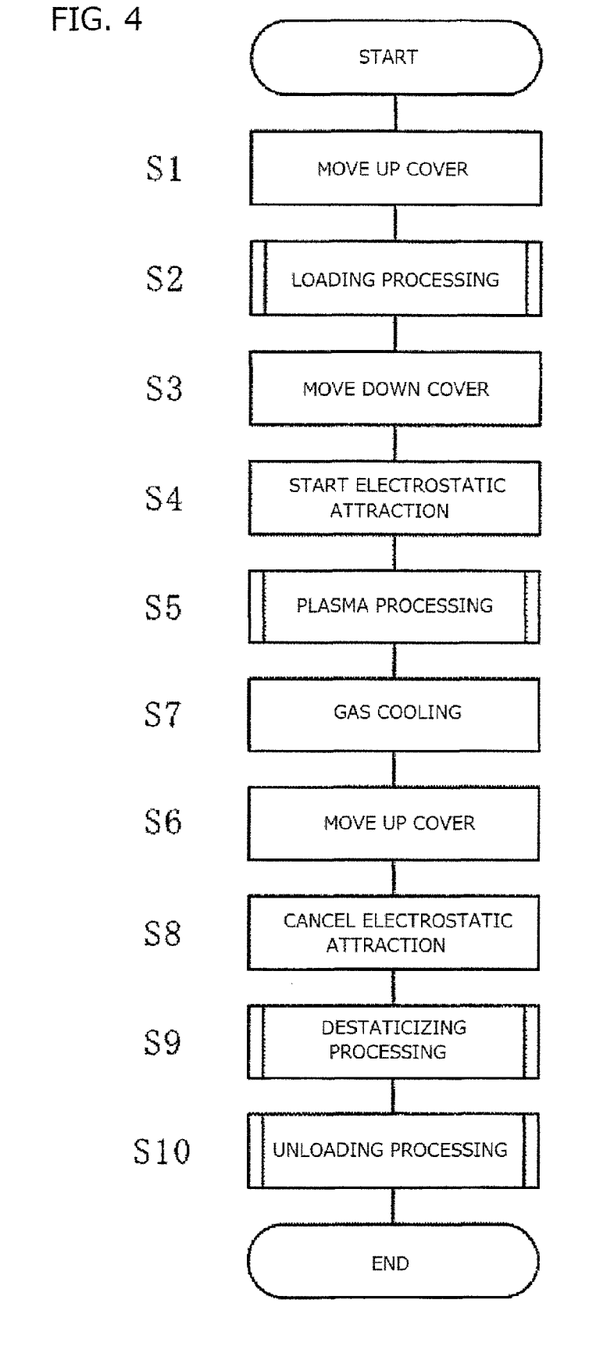
FIG. 4 is a flowchart showing plasma processing according to another embodiment.

In the embodiment, the cover 24 is moved up immediately after the plasma processing. However, as shown in FIG. 4, the cover 24 may be moved up after supplying the cooling gas and performing cooling of the cover. In this case, pressure within the chamber 3 at a time of supplying the cooling gas thereto is set to a high value (in a range from 30 to 100 Pa, for example) as compared with a value (almost in a range from 1 to 20 Pa, for example) at a time of supplying the process gas during the processing. Thus, the cover 24 etc. can be cooled effectively. After moving up the cover 24, the electrostatic attraction is cancelled and the destaticizing processing is carried out. When the destaticizing processing is carried out, adhered state of the transfer carrier 4 to the stage 11 is cancelled, and hence heat radiation of the transfer carrier 4 to the sheet 11 is not performed sufficiently. However, as the cover 24 is already cooled by the cooling gas, the holding sheet 6 is not thermally damaged.

Figure 5:
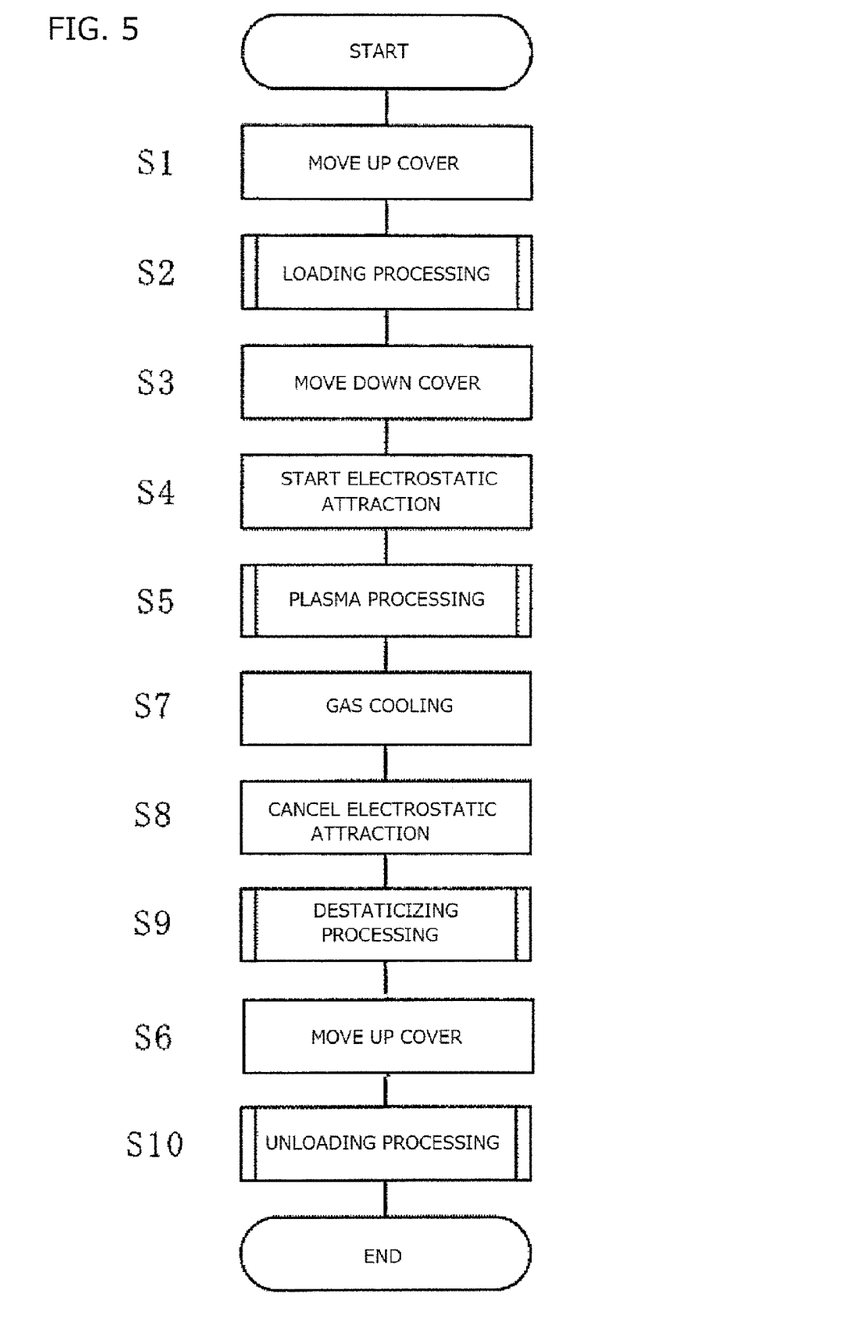
FIG. 5 is a flowchart showing plasma processing according to still another embodiment.

Alternatively, as shown in FIG. 5, the cover 24 may be moved up after supplying the cooling gas, cooling the cover and carrying out the destaticizing processing. When the destaticizing processing is carried out, adhered state of the transfer carrier 4 to the stage 11 is cancelled, and hence heat radiation of the transfer carrier 4 to the sheet 11 is not performed sufficiently. However, as the cover 24 is already cooled by the cooling gas, the holding sheet 6 is not thermally damaged.

Each of the embodiments is explained as to a case that cooling of the cover 24 in the cooling process is performed by supplying the cooling gas. Alternatively, the cover 24 may be cooled in a manner that a predetermined waiting time is provided after the termination of the plasma processing and next processing is suspended during the waiting time. The waiting time may be set almost to a range from 1 to 5 minutes, for example. However, in this case, when the cooling of the wafer is insufficient, the waiting time may be prolonged or the cooling process using the cooling gas may be additionally employed.

Although the cover 24 according to each of the embodiments is entirely constituted of single material, the cover may be constituted of composite material combined by material with superior heat resistance and material with superior thermal conductivity.

Although the driving mechanism 27 according to each of the embodiments moves the cover 24 up and down with respect to the stage 11 via the driving rods 26, the stage 11 may be moved up and down with respect to the cover 24 which is fixed within the chamber 3.

The electrostatic chucking electrode is not limited to the bipolar type according to each of the embodiments but may be a unipolar type.

Further, processing executed in the plasma processing apparatus 1 is not limited to the plasma dicing and the plasma ashing, but may be normal dry etching, for example. Furthermore, the plasma processing apparatus 1 is not limited to an ICP (Inductively Coupled Plasma) type according to the embodiments, but may be a parallel plate type. The invention can also be applied to other plasma processing apparatuses such as a plasma CVD (Chemical Vapor Deposition) apparatus.

What is claimed is:

1. A plasma processing method of carrying out plasma processing within a processing chamber on a substrate which is held by a transfer carrier constituted of an annular frame and a holding sheet, the method comprising:
   a first step of mounting the transfer carrier holding the substrate on a stage which is cooled and provided within the processing chamber;
   a second step of changing a distance between the stage and a cover provided above the stage to cover the holding sheet and the frame of the transfer carrier by the cover in a state of exposing the substrate from a window part formed at the cover;
   a third step of carrying out plasma processing on the substrate held by the transfer carrier;
   a fourth step of cooling the cover; and
   a fifth step of unloading the transfer carrier holding the substrate from the processing chamber,
   wherein in the fourth step, heat transfer gas is introduced to the processing chamber to cool the cover while the heat transfer gas is exhausted by a pressure reducing mechanism.

2. The plasma processing method according to claim 1, wherein
   in the third step, the transfer carrier is electrostatically attracted to the stage, and
   between the third step and the fifth step, destaticizing processing of discharging a destaticizing gas for eliminating electric charges of the transfer carrier is carried out after stopping the electrostatic attraction of the transfer carrier to the stage.

3. The plasma processing method according to claim 1, wherein
   the fourth step is carried out in a state that a distance between the cover and the stage is made larger in the fourth step than the distance between the cover and the stage in the second step.

4. The plasma processing method according to claim 1, wherein in the fourth step, a pressure within the processing chamber during introducing the heat transfer gas is higher than a pressure during the plasma processing.

5. The plasma processing method according to claim 1, wherein in the fourth step, an inert gas is used as the heat transfer gas.

6. The plasma processing method according to claim 2, further comprising:
   a changing step of changing the distance between the cover and the stage larger than the distance between the cover and the stage in the third step, wherein
   after the third step is terminated, the changing step, the fourth step, stopping of the electrostatic attraction of the transfer carrier to the stage by stopping application of a DC voltage to electrostatic chucking electrodes from a DC power source, destaticizing processing of discharging the destaticizing gas for eliminating electric charges of the transfer carrier and the fifth step, are carried out in this order.

7. The plasma processing method according to claim 2, further comprising:

a changing step of changing the distance between the cover and the stage larger than the distance between the cover and the stage in the third step, wherein after the third step is terminated, the fourth step, the changing step, stopping of the electrostatic attraction of the transfer carrier to the stage by stopping application of a DC voltage to electrostatic chucking electrodes from a DC power source, destaticizing processing of discharging the destaticizing gas for eliminating electric charges of the transfer carrier and the fifth step, are carried out in this order.

8. The plasma processing method according to claim 2, further comprising:

a changing step of changing the distance between the cover and the stage larger than the distance between the cover and the stage in the third step, wherein after the third step is terminated, the fourth step, stopping of the electrostatic attraction of the transfer carrier to the stage by stopping application of a DC voltage to electrostatic chucking electrodes from a DC power source, destaticizing processing of discharging the destaticizing gas for eliminating electric charges of the transfer carrier, the changing step and the fifth step, are carried out in this order.

* * * * *